US006580591B2

(12) United States Patent  
Landy

(10) Patent No.: US 6,580,591 B2
(45) Date of Patent: Jun. 17, 2003

(54) SWITCHED ELECTROSTATIC DISCHARGE RING FOR INTEGRATED CIRCUITS WITH MULTIPLE POWER INPUTS

(75) Inventor: Patrick J. Landy, Melborne, FL (US)

(73) Assignee: Intersil Americas, Inc., Milpitas, CA (US)

( * ) Notice: Subject to any disclaimer, the term of this patent is extended or adjusted under 35 U.S.C. 154(b) by 124 days.

(21) Appl. No.: 09/746,736

(22) Filed: Dec. 21, 2000

(65) Prior Publication Data

US 2002/0080537 A1 Jun. 27, 2002

(51) Int. Cl.$^7$ ............................. H02H 9/00; H02H 3/20; H02H 3/22; H02H 7/12
(52) U.S. Cl. ............................ 361/56; 361/56; 361/58; 361/91.1; 361/111; 361/118; 361/119
(58) Field of Search ........................ 361/56, 58, 91.1, 361/111, 118, 119

(56) References Cited

U.S. PATENT DOCUMENTS

| | | | | |
|---|---|---|---|---|
| 5,717,558 A | * | 2/1998 | Lynn et al. | 370/280 |
| 6,075,686 A | * | 6/2000 | Ker | 361/56 |
| 6,104,588 A | * | 8/2000 | Hariton et al. | 361/111 |

OTHER PUBLICATIONS

A. Abidi, "Direct–Conversion Radio Transceivers for Digital Communications", *IEEE Journal of Solid–State Circuits*, vol. 30, No. 12, Dec. 1995, pp. 1399–1410.

B. Razavi, "Design Considerations for Direct–Conversion Receivers", *IEEE Transactions on Circuits and Systems—II: Analog and Digital Signal Processing*, vol. 44, No. 6, Jun. 1997, pp. 428–435.

J. Cavers et al., "Adaptive Compensation for Imbalance and Offset Losses in Direct Conversion Transceivers", *IEEE Transactions on Vehicular Technology*, vol. 42, No. 4, Nov. 1993, pp. 581–588.

A. Bateman et al., "Direct Conversion Transceiver Design for Compact Low–Cost Portable Mobile Radio Terminals", *IEEE Veh. Tech. Conf.*, 1989, pp. 57–62.

S. Sampei et al., "Adaptive DC–Offset Compensation Algorithm for Burst Mode Operated Direct Conversion Receivers", *IEEE Veh. Tech. Conf.*, 1992, pp. 93–96.

* cited by examiner

Primary Examiner—Brian Sircus
Assistant Examiner—Danny Nguyen
(74) Attorney, Agent, or Firm—Gary R. Stanford

(57) ABSTRACT

An electrostatic discharge (ESD) switch circuit for an integrated circuit (IC) with multiple power inputs for improving pin-to-power isolation of the IC. The IC includes a plurality of positive power pins and a corresponding plurality of negative power pins. The IC also includes an ESD ring network with a high ESD bus and a low ESD bus. The IC further includes a control circuit indicating one of several operational modes. The ESD switch circuit includes a first switch circuit that couples the high ESD bus to a first positive power pin in a first operational mode and that couples the high ESD bus to a second positive power pin in a second operational mode. The ESD switch circuit further includes a second switch circuit that couples the low ESD bus to a first negative power pin in the first operational mode and that couples the low ESD bus to a second negative power pin in the second operational mode. When power is removed or when the IC is disconnected from other circuitry, the switch circuit disconnects the power inputs from the ESD buses so that ESD conduction operates as normal.

28 Claims, 3 Drawing Sheets

SWITCHED ELECTROSTATIC DISCHARGE RING FOR INTEGRATED CIRCUITS WITH MULTIPLE POWER INPUTS

FIELD OF THE INVENTION

The present invention relates to integrated circuit (IC) protection circuits, and more particularly to a switched electrostatic discharge (ESD) ring for ICs with multiple power inputs to improve ESD protection and pin isolation.

DESCRIPTION OF RELATED ART

ICs are subject to damage by ESD while they are being handled during testing, packing, shipping or assembly onto a printed circuit board (PCB). Static charge may build up on the IC package body, a human being or test/handling equipment and then discharge through one or more external pins of the IC thereby damaging the internal circuitry of the IC. Extra circuits are often added to the IC to mitigate this problem.

A simple known ESD network includes a first series of diodes each having their anodes connected to respective IC pins and their cathodes connected to the positive power (or voltage) supply pin. A second series of diodes are provided having their anodes connected to ground or the negative power pin and their cathodes connected to respective IC pins. It is noted that throughout this disclosure, reference to "negative" power pins, voltages, voltage rails, terminals or nodes with reference to power-related pins includes ground pins depending upon IC configuration (e.g., the negative power pins may be or otherwise include ground pins). Thus, each pin is coupled between the positive and negative power inputs via a pair of ESD diodes. A voltage clamp, such as a Zener diode or the like, is also coupled between the positive and negative supply pins. The voltage clamp draws current when the voltage across it exceeds its threshold voltage level. When the IC is mounted to a PCB and powered on, each of the ESD diodes are reversed biased as long as the voltages on the pins are between the supply voltage. An ESD pulse that would otherwise cause any pin to rise significantly above the positive voltage rail or below the negative voltage rail (or ground) forward biases a corresponding ESD diode to protect the internal circuitry. When the IC is isolated and not connected to a power supply, an ESD pulse applied between any two pins activates two or more corresponding ESD diodes and the voltage clamp so that current flows directly through the pins to protect the internal circuitry.

The simple ESD network just described provides good isolation between respective pins. Noise from the power supply or ground, however, couples to any one or more of the pins and to the rest of the circuit connected to these pins. In this manner, the simple ESD network provides sufficient isolation from pin to pin, but does not provide sufficient isolation between the pins and the power supply terminals (positive and negative and/or ground). A potential solution is to use the ESD network with dedicated, quiet supply and/or ground pins.

Many circuits have multiple power inputs with a corresponding multiple of positive and negative supply pins. For example, the IC may include two different circuits, each with a corresponding power input, where each power input has a voltage pin and a ground or negative pin. The internal supply and ground buses may be noisy, so the use of a pair of dedicated ESD rings is commonly used. The dual ring ESD network is similar to the simple ESD network described above, except that the ESD diodes are connected between an ESD high bus line and an ESD low bus line (the buses forming the ESD rings). Also, the positive and negative power pins for the two circuits are coupled to the ESD high and low buses, respectively, in a similar manner. At least one voltage clamp is typically placed between the ESD high and low bus lines. Multiple voltage clamps may be used and placed in parallel at different locations in the IC to reduce the distance traveled by large ESD event currents. For example, two separate voltage clamps may be provided, one for each of the circuits, or four clamps may be distributed among the four corners of the IC, etc.

If the first and second power supply voltages are kept below the breakdown voltage of the clamp devices, the ESD high and low buses are ideally direct current (DC) open-circuited. AC currents and voltages can be coupled through the capacitances of the various ESD diodes and drive the ESD high and low buses. In practice, even for the DC case, diodes are not perfect DC open circuits and some leakage current is often present which causes the ESD high bus to be near one of the positive supply voltages and the ESD low bus to be near ground or a negative supply voltage. The conduction of ESD pulses is similar to that described for the simple ESD circuit described previously when the IC is not connected or not powered. The dual ESD ring configuration provides better isolation between any one or more of the signal pins and the corresponding power supplies, but provides relatively poor isolation between any two or more signal pins.

Radio frequency (RF) ICs, for example, often have multiple circuits and corresponding power inputs, such as separate power inputs for transmit and receive circuitry. For example, a half duplex RF communication system includes a radio that switches between transmit and receive modes of operation. RF ICs require a relatively high pin-to-pin isolation such as equal to or greater than 60 decibel (dB) isolation. The solutions previously described either do not provide the desired level of isolation between the pins or do not provide a practical solution. The dual ring configuration described above does not provide the desired isolation between pins. Additional dedicated supply pins used exclusively for the ESD high and low buses increase package size and cost and are not practical for many RF applications. For example, many RF applications are implemented on battery-powered portable and/or mobile units that require reduced cost, size, power usage and weight solutions and maximal operating efficiency. Larger packages have increased parasitics, which can decrease isolation and overall IC performance. Also, extra pins require additional external components, such as decoupling capacitors and the like, which significantly increases circuit layout area.

SUMMARY OF THE INVENTION

An electrostatic discharge (ESD) switch circuit for an integrated circuit (IC) with multiple power inputs according to the present invention improves pin-to-power isolation of the IC. The IC includes a plurality of positive power pins and a corresponding plurality of negative power pins (which may be ground pins, depending upon the configuration). The IC also includes an ESD ring network with a high ESD bus and a low ESD bus. The IC further includes a control circuit indicating one of several operational modes. The ESD switch circuit includes a first switch circuit that couples the high ESD bus to a first positive power pin in a first operational mode. The ESD switch circuit further includes a second switch circuit that couples the low ESD bus to a first negative power pin in the first operational mode. In this manner, the first and second switch circuits provide greater isolation in the first operational mode.

The first and second switch circuits may further disconnect the high and low ESD buses from the first positive and negative power pins, respectively, in a second operational mode. Such is advantageous, for example, when the first positive and negative power pins are employed to provide power during the second operational mode. The first and second switch circuits may further couple the high and low ESD buses, respectively, to the second positive and negative power pins, respectively, in the second operational mode. In the second operational mode, the first and second switch circuits may further disconnect the high and low ESD buses, respectively, from the second positive and negative power pins, respectively.

The first and second switch circuits may further disconnect the high ESD bus from the first and second positive power pins and the low ESD bus from the first and second negative power pins, respectively, when power is removed. In this manner, when the IC is powered down or otherwise disconnected from a circuit, normal ESD current conduction takes place, such as through ESD diodes and the voltage clamp to remove high voltage ESD pulses from the internal circuitry. If a third operational mode is employed, the first and second switch circuits may further couple the high ESD bus to the first and second positive power pins and the low ESD bus to the first and second negative power pins, respectively, in the third operational mode.

In one embodiment, for example, the IC is a half-duplex RF IC with a control circuit that indicates either transmit mode or receive mode. The control circuit may be employed, for example, to connect an antenna to transmit circuitry during transmit mode and to receive circuitry during receive mode. When the transmit circuit is active in the transmit mode, the switch circuit couples the receive circuit voltage supply pins to the ESD buses to improve isolation for the transmit circuit. Likewise, when the receive circuit is active in the receive mode, the switch circuit couples the transmit circuit voltage supply pins to the ESD buses to improve isolation for the receive circuit. Decoupled supply pins provide an excellent low impedance AC ground path. By coupling the ESD buses to a low impedance AC ground path, signals coupled to these buses are largely directed through the supply pin. This has the desired effect of reducing any coupling to other pins. It is noted, however, that the present invention applies to any number of power inputs and internal circuitry.

The first switch circuit may include a first switch that selectively couples the first positive power pin to the high ESD bus in the first operational mode and a second switch that selectively couples the second positive power pin to the high ESD bus in the second operational mode. The second switch circuit may include a third switch that selectively couples the first negative power pin to the low ESD bus in the first operational mode and a fourth switch that selectively couples the negative power ground pin to the low ESD bus in the second operational mode. In this manner, the switch circuit includes four separate switches, one for each power supply pin. More particularly, the first switch has a closed position to couple the first positive power pin to the high ESD bus in the first operational mode and an open position to disconnect the first positive power pin from the high ESD bus in the second operational mode or when power is removed. The second switch has a closed position to couple the first negative power pin to the low ESD bus in the first operational mode and an open position to disconnect the first negative power pin from the low ESD bus in the second operational mode or when power is removed. The third and fourth switches have open and closed positions that operate in a similar manner with respect to the second positive power and negative power pins.

In an alternative embodiment, the first switch circuit includes a multiple position switch having a first position that couples the high ESD bus to the first positive power pin when the IC is in the first operational mode, a second position that couples the high ESD bus to the second positive power pin when the IC is in the second operational mode, and a third position that disconnects the high ESD bus from either of the first and second positive power pins. The second switch circuit includes another multiple position switch with three positions that couples the low ESD bus to the first or second negative power pins when the IC is in the first or second operational modes, respectively, and a third position that disconnects the low ESD bus from either of the first and second negative power pins.

An ESD protection circuit for an IC according to the present invention includes a high ESD bus, a low ESD bus, first and second ESD clamp circuits and a switch circuit. The switch circuit selectively couples first positive power and negative power pins to the high and low ESD buses, respectively, when the second circuit is indicated as operationally active and selectively couples second positive power and negative power pins to the high and low ESD buses, respectively, when the first circuit is indicated as operationally active. The IC includes a control circuit that indicates which circuit is operationally active. The first and second ESD clamp circuits each comprise a plurality of ESD diodes that electrically clamp each IC pin to the high and low ESD buses. At least one voltage clamp may be provided that is coupled between the high and low ESD buses. The switch circuit includes multiple two-position switches or multi-position switches that operate in a similar manner as previously described as controlled by the control circuit.

An IC implemented according to the present invention includes a plurality of pins including a plurality of positive power pins and a corresponding plurality of negative power pins, a first circuit that receives power via the first positive power and negative power pins, a second circuit that receives power via the second positive power and negative power pins, a control circuit that indicates operational mode of the first and second circuits, an ESD network that includes a high ESD bus and a low ESD bus, and a switch circuit. The switch circuit selectively couples first positive power and negative power pins and second positive power and negative power pins to the high and low ESD buses, respectively, based on the operational mode indicated by the control circuit.

In a more particular embodiment, the IC is a radio frequency (RF) communication chip that includes a transmit circuit that is active in transmit mode and a receive circuit that is active in receive mode. In any of the embodiments, the switch circuitry or switches may be implemented with any type of electronic switching devices, such as transistors or the like. Bipolar transistors or MOSFETs are contemplated.

A method of providing ESD protection for the IC includes detecting an operating mode of the IC and coupling a second positive power pin and a second negative power pin to high and low ESD buses, respectively, when a first mode is detected. The method may further include disconnecting the second positive power pin and the second negative power pin from the high and low ESD buses, respectively, when a second mode is detected. The method may further include coupling a first positive power pin and a first negative power pin to the high and low ESD buses, respectively, when the second mode is detected. The method may further include disconnecting the first positive power pin and the first negative power pin from the high and low ESD buses, respectively, when the first mode is detected. The method may further include coupling the first positive power pin and the first negative power pin to the high and low ESD buses, respectively, and coupling the second positive power pin and the second negative power pin to the high and low ESD buses, respectively, when a third mode is detected. The method may further include disconnecting the first and second power and negative power pins from the high and low ESD buses when power is removed.

BRIEF DESCRIPTION OF THE DRAWINGS

A better understanding of the present invention can be obtained when the following detailed description of exemplary embodiments are considered in conjunction with the following drawings.

DETAILED DESCRIPTION OF EMBODIMENT(S) OF THE INVENTION

Figure 1:
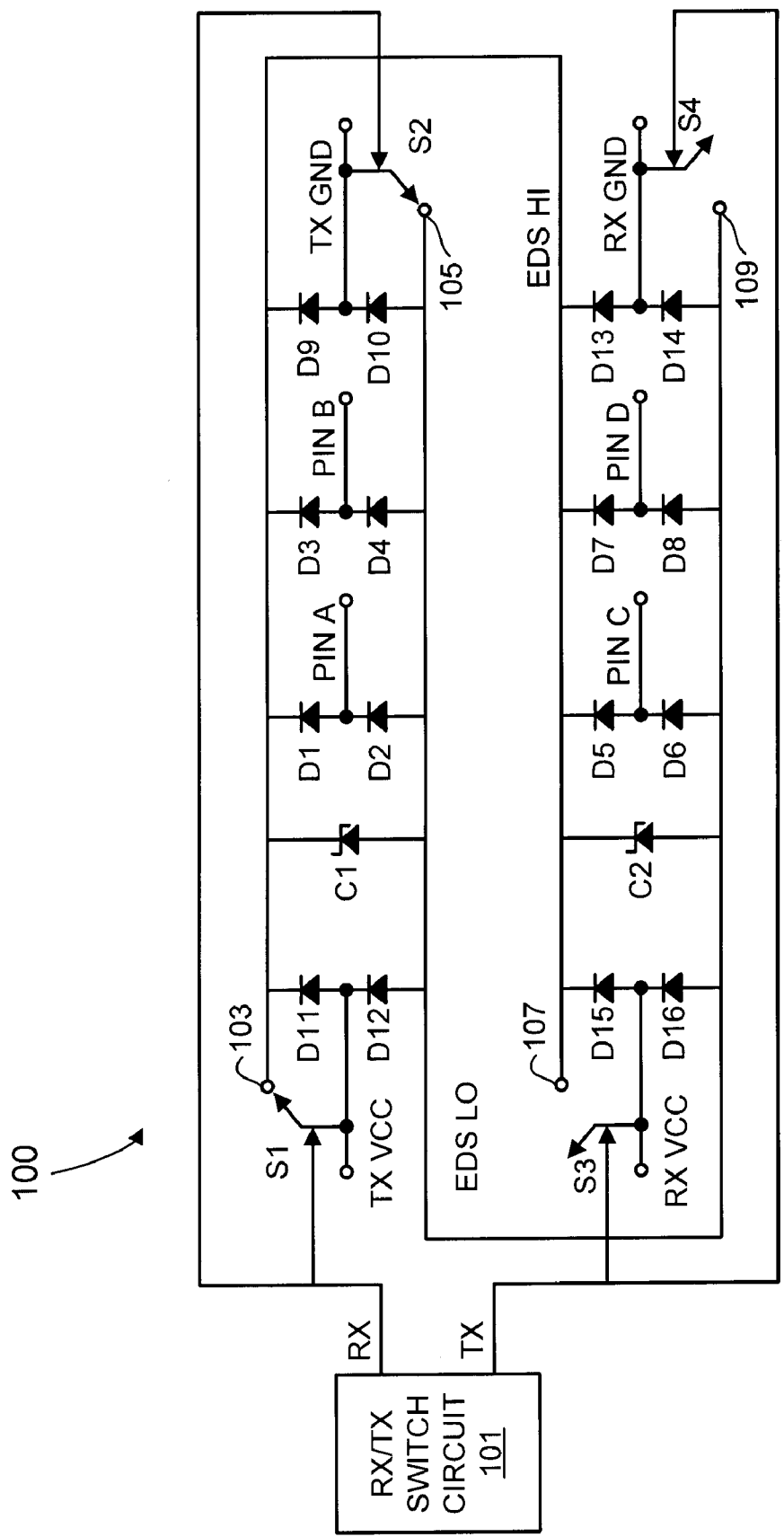
FIG. 1 is a schematic and block diagram of a simplified radio frequency (RF) integrated circuit (IC) including an exemplary electrostatic discharge (ESD) protection circuit with an ESD switch circuit implemented in accordance with an embodiment of the present invention.

FIG. 1 is a schematic and block diagram of a simplified radio frequency (RF) integrated circuit (IC) 100 including an exemplary electrostatic discharge (ESD) protection circuit with an ESD switch circuit implemented in accordance with an embodiment of the present invention. The RF IC 100 includes several external pins which are further grouped into transmit or receive functions. A TX $V_{CC}$ pin and a TX Gnd pin are provided to couple to an external voltage source (not shown) for providing power to an internal transmit circuit (not shown) of the RF IC 100. Two external signal pins, referred to as PIN A and PIN B, are shown that represent the external signal pins associated with and coupled to the transmit circuit. In a similar manner, an RX $V_{CC}$ pin and a corresponding RX Gnd pin are provided to couple to another external voltage source (not shown) for providing power to an internal receive circuit (not shown) of the RF IC 100. Another two external signal pins, referred to as PIN C and PIN D, are shown that represent the external pins associated with and coupled to the receive circuit.

It is understood that the RF IC 100 shown is a simplified representation and that many additional external pins would typically be included. Each of the pins PIN A-PIN D represent any type of input, output or input/output (I/O) pin for the RF IC 100. It is also understood that power is, in general, applied between positive and negative power pins, where the negative power pins may be or otherwise include ground pins, such as the TX Gnd and RX Gnd as shown. The present invention also contemplates positive, negative and ground pins for an IC.

A plurality of ESD diodes D1–D16 are shown for providing ESD protection for each of the external pins, including TX $V_{CC}$, TX Gnd, RX $V_{CC}$, RX Gnd, PIN A, PIN B, PIN C and PIN D. The ESD diodes D1–D16 are coupled to two ESD buses of a dual ESD ring configuration including an "ESD HI" bus and an "ESD LO" bus. In particular, the anodes of ESD diodes D2, D4, D6, D8, D10, D12, D14 and D16 are coupled to the ESD LO bus. The cathodes of ESD diodes D1, D3, D5, D7, D9, D11, D13 and D15 are coupled to the ESD HI bus. For the transmit circuit, the anode of diode D11 and the cathode of diode D12 are coupled to the TX $V_{CC}$ pin. The anode of diode D9 and the cathode of diode D10 are coupled to the TX Gnd pin. The anode of diode D1 and the cathode of diode D2 are coupled to PIN A. The anode of diode D3 and the cathode of diode D4 are connected to PIN B. For the receive circuit, the anode of diode D15 and cathode of diode D16 are coupled to the RX $V_{CC}$ pin. The anode of diode D13 and the cathode of diode D14 are coupled to the RX Gnd pin. In a similar manner, the anode of diode D5 and the cathode of diode D6 are coupled to PIN C and the anode of diode D7 and the cathode of diode D8 are coupled to PIN D.

A voltage clamp C1, represented as a Zener diode or the like, has its anode connected to the ESD LO bus and its cathode connected to the ESD HI bus for the transmit circuit. In a similar manner, a second voltage clamp C2 has its anode connected to the ESD LO bus and its cathode connected to the ESD HI bus for the receive circuit. The clamps C1 and C2 may be Zener diodes in one embodiment. Alternatively, the clamps C1 and C2 comprise dynamic triggered clamps, such as silicone controlled rectifiers (SCRs) or resistive/capacitive (RC) networks or the like. The clamps C1, C2 are generally configured to trigger in response to non-operational events, such as ESD pulses or the like, that are not generated by the transmit or receive circuits. The clamps C1 and C2 handle very large voltage and voltage changes in a short amount of time to protect the internal circuits of the RF IC 100. Again, a single clamp or any number of clamps may be used.

It is noted that although two separate voltage clamps are shown, it is understood that any suitable number of voltage clamps may be employed depending upon the configuration of the IC. In general, at least one voltage clamp is typically placed between the ESD high and low bus lines. Multiple voltage clamps may be used and placed in parallel at different locations in the IC to reduce the distance traveled by large ESD event currents. For example, two separate voltage clamps may be provided, one for each of the circuits, or four clamps may be distributed among the four corners of the IC, etc. The illustrated embodiment with the two voltage clamps C1 and C2 is exemplary only.

The RF IC 100 further includes four switches S1, S2, S3 and S4. The switches S1 and S2 are associated with the transmit circuit and the switches S3 and S4 are associated with the receive circuit. In particular, the switches S1 and S2 are coupled to the TX $V_{CC}$ and TX Gnd pins, respectively, and the switches S3 and S4 are coupled to the RX $V_{CC}$ and RX Gnd pins, respectively. A closed position 103 of the switch S1 is coupled to the ESD HI bus. A closed position 105 of the switch S2 is coupled to the ESD LO bus. In a similar manner, a closed position 107 of the switch S3 is coupled to the ESD HI bus and a closed position 109 of the switch S4 is coupled to the ESD LO bus. In this manner, the switch S1 selectively couples the TX $V_{CC}$ pin to the ESD HI bus or selectively disconnects the TX $V_{CC}$ pin from the ESD HI bus. The switch S2 selectively couples the TX Gnd pin to the ESD LO bus or selectively disconnects the TX Gnd pin from the ESD LO bus. The switch S3 selectively couples the RX $V_{CC}$ pin to the ESD HI bus or selectively disconnects the RX $V_{CC}$ pin from the ESD HI bus. The switch S4 selectively couples the RX Gnd pin to the ESD LO bus or selectively disconnects the RX Gnd pin from the ESD LO bus.

The switches S1–S4 are configured to function as normally open single-pole, single-throw (SPST) switches. Rather than actual SPST switches, any available or common electronic switch element may be utilized, such as transistors or the like. Bipolar transistors are contemplated. Metal-oxide semiconductor (MOS) transistors, field effect transistors (FETs), and MOSFETs (e.g. GaAs MOSFETs) are also contemplated and may be desirable for reduced power consumption. Each of the switches S1–S4 includes a control input or the like for opening and closing the switch.

The RF IC 100 further includes a receive/transmit (RX/TX) switch circuit 101, which further asserts a separate receive (RX) signal and a separate transmit (TX) signal. The RX signal is "asserted" by the RX/TX switch circuit 101 when the RF IC 100 is in a receive mode of operation while the receive circuit is operating or operationally active. The RX signal is otherwise "negated" indicating that the receive circuit is inactive. In a similar manner, the TX signal is asserted by the RX/TX switch circuit 101 when the RF IC 100 is in the transmit mode of operation while the transmit circuit is operating or operationally active. The TX signal is otherwise negated indicating that the transmit circuit is inactive. In the embodiment shown, the RX/TX switch circuit 101 asserts only one of the RX and TX signals at a time in accordance with half-duplex RF communications. It is noted that a signal is high or a logic "one" when asserted and is low or a logic "zero" when negated according to positive logic convention. The signals may conform to negative logic as well.

In operation, the RX/TX switch circuit 101 asserts the RX signal and negates the TX signal when the RF IC 100 is in the receive operational mode, which closes the switches S1 and S2 and opens the switches S3 and S4. In the receive mode, therefore, the TX $V_{CC}$ pin is coupled to the ESD HI bus and the TX Gnd pin is coupled to the ESD LO bus, whereas the RX $V_{CC}$ pin is disconnected from the ESD HI bus and the RX Gnd is disconnected from the ESD LO bus. In a similar manner, the RX/TX switch circuit 101 asserts the TX $V_{CC}$ signal when the RF IC 100 is in transmit operational mode, which therefore closes switches S3 and S4 and opens switches S1 and S2. In the transmit mode, therefore, the RX $V_{CC}$ pin is coupled to the ESD HI bus and the RX Gnd pin is coupled to the ESD LO bus, whereas the TX $V_{CC}$ pin is disconnected from the ESD HI bus and the TX Gnd is disconnected from the ESD LO bus. It is noted that when the RF IC 100 is disconnected or when power is otherwise removed, then all of the switches S1–S4 default to the open position so that the dual ESD discharge rings operate in normal manner.

The RF IC 100 may have other operational modes other than transmit or receive. In any other operational mode, the switches S1–S4 may all be placed in the open position or in the closed position. Generally, if the transmit circuit is inactive while the RF IC 100 is powered on, then it is advantageous to close the S1 and S2 switches to remove or otherwise reduce coupling from other circuitry including the receive circuit if active. Also, if the received circuit is inactive while the RF IC 100 is powered on, then it is advantageous to close the S3 and S4 switches to remove or otherwise reduce coupling from other circuitry including the transmit circuit if active.

It is appreciated that switched ESD rings as described herein improves isolation. Decoupled supply pins provide an excellent low impedance AC ground path. By coupling the ESD buses to a low impedance AC ground path, signals coupled to these buses are largely directed through the supply pin. This has the desired effect of reducing any coupling to other pins. The positive and negative power pins for circuitry that is not currently operating operates to "quiet" the non-operational power supply.

Figure 2:
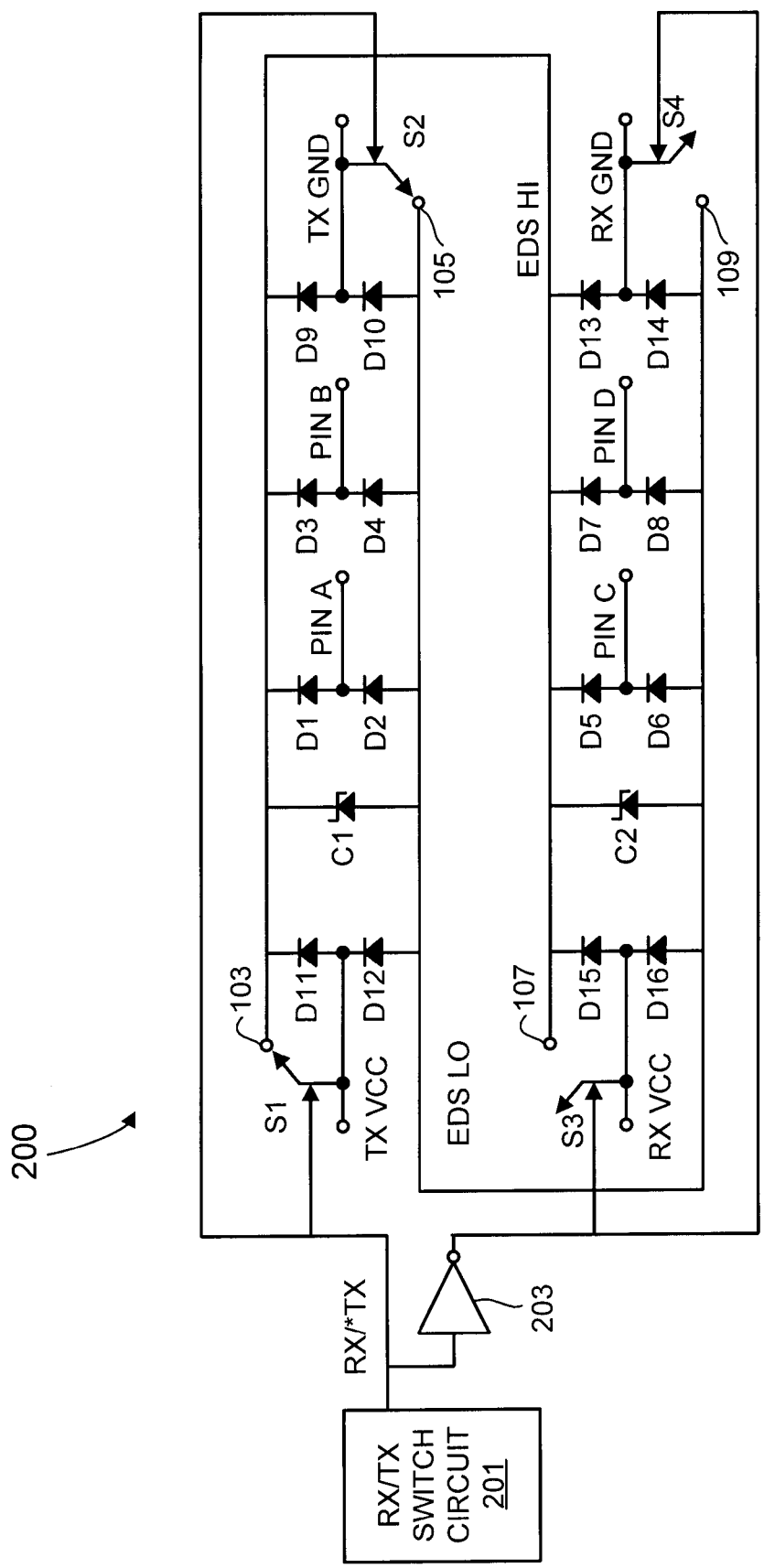
FIG. 2 is a block and schematic diagram of an RF IC with another ESD switch circuit implemented according to an alternative embodiment of the present invention.

FIG. 2 is a block and schematic diagram of an RF IC 200 according to an alternative embodiment of the present invention. Similar devices and components assume identical reference numbers. In particular, the switches S1–S4, the external pins PIN A-PIN D, TX $V_{CC}$, TX Gnd, RX $V_{CC}$, and RX Gnd, the ESD diodes D1–D16 and the voltage clamps C1 and C2 are coupled and substantially identical manner. In this case, however, the RX/TX switch circuit 101 is replaced with a similar RX/TX switch circuit 201, which asserts a single RX/*TX signal rather than two separate RX and TX signals, where an asterisk "*" denotes negative logic (asserted when low). The RX/*TX signal is provided to the control inputs of switches S1 and S2 and to the input of an inverter 203. The output of the inverter 203 is provided to the control inputs of the switches S3 and S4.

Operation of the RF IC 200 is similar to that described above for the RF IC 100, except that a single control signal RX/*TX is used to control the switches S1–S4. In particular, the RX/TX switch circuit 201 asserts the RX/*TX signal high in receive mode, which closes the switches S1 and S2 and opens the switches S3 and S4. In the transmit mode, the RX/TX switch circuit 201 asserts the RX/*TX signal low, which closes the switches S3 and S4 and opens the switches S1 and S2. When the RF IC 200 is powered off or otherwise disconnected from external RF circuitry, all of the switches S1–S4 are in the open position. The RX/*TX signal may have a tri-state or high impedance stated for opening all of the switches S1–S4 if desired.

Figure 3:
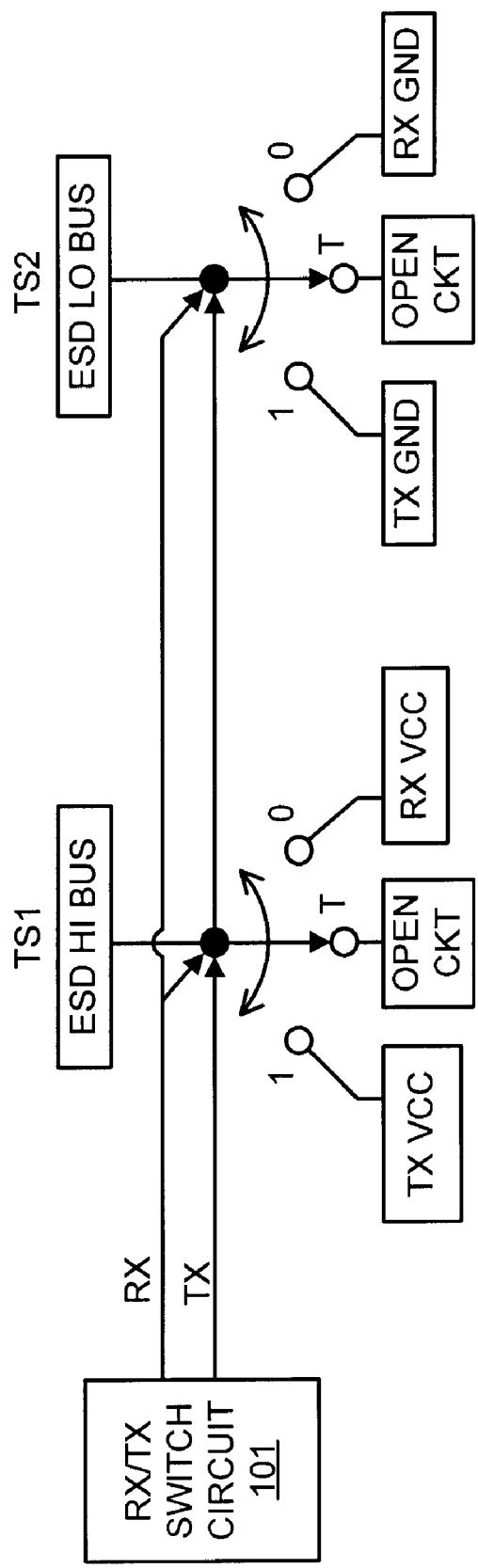
FIG. 3 is a simplified schematic diagram of another exemplary alternative switch configuration that may be employed in either of the RF ICs of FIGS. 1 or 2.

FIG. 3 is a simplified schematic diagram of an exemplary alternative switch configuration that may be employed in either the RF IC 100 or the RF IC 200. The switches S1 and S3 are replaced by a single-pole, triple-throw (SPTT) type switch TS1 and the switches S2 and S4 are replaced by another SPTT type switch TS2. Again, electronic switch circuitry, based on bipolar transistors or MOSFETs or the like, is used to implement the desired switch functionality. Each of the switches TS1 and TS2 includes three separate positions or states, including binary 1, binary 0 and a tri-state or open circuit position T. The switch TS1 operates to selectively couple the ESD HI bus to the TX $V_{CC}$ pin in the binary 1 position or to the RX $V_{CC}$ pin in the binary 0 position. Otherwise, the switch TS1 is in the open circuit or tri-state position T. Likewise, the switch TS2 operates to selectively couple the ESD LO bus to the TX Gnd pin in the binary 1 position or to the RX Gnd pin in the binary 0 position. Otherwise, the switch TS2 is in the open circuit or tri-state position T. The RX/TX switch circuit 101 asserts the RX and TX signals to corresponding control inputs of the switches TS1 and TS2 to establish three separate states for each of the switches TS1 and TS2.

In operation, when the RX/TX switch circuit 101 asserts the RX signal for the receive mode, then both switches TS1 and TS2 are placed in the binary 1 position thereby coupling the TX $V_{CC}$ pin to the ESD HI bus and the TX Gnd pin to the ESD LO bus. When the RX/TX switch circuit 101 asserts the TX signal, then the switches TS1 and TS2 both assume the binary 0 position thereby coupling the RX $V_{CC}$ pin to the ESD HI bus and the RX Gnd pin to the ESD LO bus. When the TX and RX signals are both negated, then the switches TS1 and TS2 are in the open circuit or T position. It is noted that the RX/TX switch circuit 201 with a single signal RX/*TX signal may be used with single control input switches TS1 and TS2. In the latter case, the RX/TX switch circuit 201 tri-states the RX/*TX signal to place the switches TS1 or TS2 in the T position. For either embodiment, the switches TS1 and TS2 are in the T position when power is removed, such as when the RF IC is powered off or otherwise disconnected from other circuitry.

It is desired to provide sufficient ESD protection and pin to pin and pin to power isolation in a zero intermediate frequency (ZIF) radio architecture that processes signals from DC to 5 gigahertz (GHz). Simulations of an actual half-duplex RF IC with a switched ESD ring in accordance with the embodiments described herein have shown a 60 dB or more improvement at low frequencies (MHz range) and 20 dB or more improvement at RF frequencies (GHz range).

The RX/TX switch circuits 101, 201 are representative control circuitry that often exists on many half-duplex RF communication ICs for switching operation between transmit and receive modes. Similar type circuitry may exist on other types of ICs with multiple power inputs providing power to respective circuitry within. If, however, such switch control circuitry does not already exist, then control circuitry is added to sense or detect a mode signal or operational mode of the IC and drive the control inputs of the switches accordingly. The particular switch configurations described herein are exemplary only and it is understood that many variations of switch circuitry are possible and contemplated and within the scope of the present invention.

Although embodiments of the ESD protection circuit with an ESD switch circuit according to the present invention has been illustrated in association with RF circuitry, it is understood that the principles described herein may be applied to any IC with multiple power inputs in which it is desired to provide ESD protection with improved pin to pin and pin to power isolation. Further, more than two power inputs are contemplated, such as including three or more power inputs with corresponding internal circuitry associated with each power input. In general, the power input pins of circuitry that is currently operating are disconnected from the ESD buses whereas the power input pins of idle circuitry are coupled to the ESD buses in a similar manner as described herein. As described previously, coupling the ESD buses to a low impedance AC ground path results in signals coupled to these buses being largely directed through the supply pin. This has the desired effect of reducing any coupling to other pins. The positive and negative power pins for circuitry that is not currently operating operates to "quiet" the non-operational power supply.

Although a system and method according to the present invention has been described in connection with one or more exemplary embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An electrostatic discharge (ESD) switch circuit for an integrated circuit (IC) with multiple power inputs, the IC including a plurality of positive power pins and a corresponding plurality of negative power pins, and the IC including an ESD ring network with a high ESD bus and a low ESD bus, and the IC including a control circuit indicating one of a plurality of operational modes, the ESD switch circuit comprising:

a first switch circuit, for coupling to the control circuit and the ESD ring network, that couples the high ESD bus to a first positive power pin in response to the control circuit indicating a first operational mode; and a second switch circuit, for coupling to the control circuit and the ESD ring network, that couples the low ESD bus to a first negative power pin in response to the control circuit indicating the first operational mode.

2. The ESD switch circuit of claim 1, further comprising:

the first switch circuit disconnecting the high ESD bus from the first positive power pin in response to the control circuit indicating a second operational mode; and the second switch circuit disconnecting the low ESD bus from the first negative power pin in response to the control circuit indicating the second operational mode.

3. The ESD switch circuit of claim 2, further comprising:

the first switch circuit coupling the high ESD bus to a second positive power pin in response to the control circuit indicating the second operational mode; and the second switch circuit coupling the low ESD bus to a second negative power pin in response to the control circuit indicating the second operational mode.

4. The ESD switch circuit of claim 3, further comprising:

the first switch circuit disconnecting the high ESD bus from the second positive power pin in response to the control circuit indicating the first operational mode; and the second switch circuit disconnecting the low ESD bus from the second negative power pin in response to the control circuit indicating the first operational mode.

5. The ESD switch circuit of claim 4, further comprising:

the first switch circuit comprising a first switch that selectively couples the first positive power pin to the high ESD bus in the first operational mode and a second switch that selectively couples the second positive power pin to the high ESD bus in the second operational mode; and the second switch circuit comprising a third switch that selectively couples the first negative power pin to the low ESD bus in the first operational mode and a fourth switch that selectively couples the second negative power pin to the low ESD bus in the second operational mode.

6. The ESD switch circuit of claim 5, further comprising:

the first switch having a closed position to couple the first positive power pin to the high ESD bus in the first operational mode and an open position to disconnect the first positive power pin from the high ESD bus in the second operational mode or when power is removed;

the second switch having a closed position to couple the first negative power pin to the low ESD bus in the first operational mode and an open position to disconnect the first negative power pin from the low ESD bus in the second operational mode or when power is removed;

the third switch having a closed position to couple the second positive power pin to the high ESD bus in the second operational mode and an open position to disconnect the second positive power pin from the high ESD bus in the first operational mode or when power is removed; and the fourth switch having a closed position to couple the second negative power pin to the low ESD bus in the second operational mode and an open position to disconnect the second negative power pin from the low ESD bus in the first operational mode or when power is removed.

7. The ESD switch circuit of claim 4, further comprising:
the first switch circuit including a first multiple position switch including a first position that couples the high ESD bus to the first positive power pin when the IC is in the first operational mode, a second position that couples the high ESD bus to the second positive power pin when the IC is in the second operational mode, and a third position that disconnects the high ESD bus from either of the first and second positive power pins; and
the second switch circuit including a second multiple position switch including a first position that couples the low ESD bus to the first negative power pin when the IC is in the first operational mode, a second position that couples the low ESD bus to the second negative power pin when the IC is in the second operational mode, and a third position that disconnects the low ESD bus from either of the first and second negative power pins.

8. The ESD switch circuit of claim 1, further comprising:
the first switch circuit operating to disconnect the high ESD bus from first and second positive power pins when power is removed; and
the second switch circuit operating to disconnect the low ESD bus from first and second negative power pins when power is removed.

9. The ESD switch circuit of claim 1, further comprising:
the first switch circuit operating to couple the high ESD bus to first and second positive power pins in response to the control circuit indicating a third operational mode; and
the second switch circuit operating to couple the low ESD bus to first and second negative power pins in response to the control circuit indicating the third operational mode.

10. An electrostatic discharge (ESD) protection circuit for an integrated circuit (IC), the IC having a plurality of internal circuits and a plurality of external pins including a plurality of positive power pins and a corresponding plurality of negative power pins and a control circuit that indicates operational activity of the first and second circuits, comprising:
a high ESD bus;
a low ESD bus;
a first ESD clamp circuit, coupled to the high and low ESD buses and for coupling to pins of the IC associated with a first internal circuit including a first positive power pin and a first negative power pin;
a second ESD clamp circuit, coupled to the high and low ESD buses and for coupling to pins of the IC associated with a second internal circuit including a second positive power pin and a second negative power pin; and
a switch circuit, coupled to the high and low ESD buses and for coupling to the control circuit, that selectively couples the first power and negative power pins to the high and low ESD buses, respectively, in response to the second circuit being indicated as operationally active by the control circuit and that selectively couples the second power and negative power pins to the high and low ESD buses, respectively, in response to the first circuit being indicated as operationally active by the control circuit.

11. The ESD protection circuit of claim 10, wherein the first and second ESD clamp circuits each comprise a plurality of ESD diodes that electrically clamp each IC pin to the high and low ESD buses.

12. The ESD protection circuit of claim 10, wherein the switch circuit comprises:
a first switch that selectively couples the first positive power pin to the high ESD bus;
a second switch that selectively couples the first negative power pin to the low ESD bus;
a third switch that selectively couples the second positive power pin to the high ESD bus; and
a fourth switch that selectively couples the second negative power pin to the low ESD bus.

13. The ESD protection circuit of claim 12, further comprising:
the first switch having a closed position to couple the first positive power pin to the high ESD bus when the second circuit is indicated as operationally active and an open position to disconnect the first positive power pin from the high ESD bus when the first circuit is indicated as operationally active;
the second switch having a closed position to couple the first negative power pin to the low ESD bus when the second circuit is indicated as operationally active and an open position to disconnect the first negative power pin from the low ESD bus when the first circuit is indicated as operationally active;
the third switch having a closed position to couple the second positive power pin to the high ESD bus when the first circuit is indicated as operationally active and an open position to disconnect the second positive power pin from the high ESD bus when the second circuit is indicated as operationally active; and
the fourth switch having a closed position to couple the second negative power pin to the low ESD bus when the first circuit is indicated as operationally active and an open position to disconnect the second negative power pin from the low ESD bus when the second circuit is indicated as operationally active.

14. The ESD protection circuit of claim 13, wherein the first, second, third and fourth switches default to their respective open positions when power is removed.

15. The ESD protection circuit of claim 10, wherein the switch circuit comprises:
a first switch that selectively couples the high ESD bus to either one of the first positive power pin and the second positive power pin; and
a second switch that selectively couples the low ESD bus to either one of the first negative power pin and the second negative power pin.

16. The ESD protection circuit of claim 15, wherein:
the first switch disconnects the high ESD bus from both of the first and second positive power pins when power is removed; and
wherein the second switch disconnects the low ESD bus from both of the first and second negative power pins when power is removed.

17. An integrated circuit (IC), comprising:
a plurality of pins including a plurality of positive power pins and a corresponding plurality of negative power pins;
a first circuit that receives power via first power and negative power pins;
a second circuit that receives power via second power and negative power pins;
a control circuit, coupled to the first and second circuits, that indicates operational mode of the first and second circuits;

an ESD network, coupled to the first and second positive power pins and the first and second negative power pins, that includes a high ESD bus and a low ESD bus; and a switch circuit, coupled to the high and low ESD buses, the first and second power and negative power pins and the control circuit, that selectively couples the first power and negative power pins and the second power and negative power pins to the high and low ESD buses, respectively, based on the operational mode indicated by the control circuit.

18. The IC of claim 17, further comprising:

the control circuit indicating that one of the first and second circuits is active;

the switch circuit operative to couple the first power and negative power pins to the high and low ESD buses, respectively, and to disconnect the second power and negative power pins from the high and low ESD buses, respectively, when the second circuit is indicated as active; and the switch circuit operative to couple the second power and negative power pins to the high and low ESD buses, respectively, and to disconnect the first power and negative power pins from the high and low ESD buses, respectively, when the first circuit is indicated as active.

19. The IC of claim 17, wherein the switch circuit further comprises:

a first switch that couples the first positive power pin to the high ESD bus when the first circuit is indicated as inactive and otherwise disconnects the first positive power pin from the high ESD bus;

a second switch that couples the first negative power pin to the low ESD bus when the first circuit is indicated as inactive and otherwise disconnects the first negative power pin from the low ESD bus;

a third switch that couples the second positive power pin to the high ESD bus when the second circuit is indicated as inactive and otherwise disconnects the second positive power pin from the high ESD bus; and a fourth switch that couples the second negative power pin to the low ESD bus when the second circuit is indicated as inactive and otherwise disconnects the second negative power pin from the low ESD bus.

20. The IC of claim 19, wherein the first, second, third and fourth switches disconnect the first and second power and negative power pins from the high and low ESD buses when power is removed.

21. The IC of claim 17, wherein the first circuit comprises a radio frequency (RF) transmit circuit, the second circuit comprises an RF receive circuit and the control circuit indicates transmit or receive mode.

22. The IC of claim 17, wherein the ESD network comprises a plurality of ESD diodes and at least one voltage clamp that couple the plurality of pins of the IC to the high and low ESD buses.

23. A method of providing improved pin-to-power isolation for an integrated circuit (IC), the IC including a plurality of positive power and negative power pins, a dual ESD ring with high and low electrostatic discharge (ESD) buses and a control circuit that indicates one of a plurality of operating modes, comprising:

detecting an operating mode of the IC; and coupling a second positive power pin and a second negative power pin to the high and low ESD buses, respectively, in response to a first operating mode being detected.

24. The method of claim 23, further comprising:

disconnecting the second positive power pin and the second negative power pin from the high and low ESD buses, respectively, in response to a second operating mode being detected.

25. The method of claim 24, further comprising:

coupling a first positive power pin and a first negative power pin to the high and low ESD buses, respectively, in response to the second operating mode being detected.

26. The method of claim 25, further comprising:

disconnecting the first positive power pin and the first negative power pin from the high and low ESD buses, respectively, in response to the first operating mode being detected.

27. The method of claim 26, further comprising:

coupling the first positive power pin and the first negative power pin to the high and low ESD buses, respectively, in response to a third operating mode being detected; and coupling the second positive power pin and the second negative power pin to the high and low ESD buses, respectively, in response to the third operating mode being detected.

28. The method of claim 26, further comprising:

disconnecting the first and second power and negative power pins from the high and low ESD buses when power is removed.

* * * * *